United States Patent [19]

Kohler et al.

[11] Patent Number: 5,218,245

[45] Date of Patent: Jun. 8, 1993

[54] PROGRAMMABLE NEURAL LOGIC DEVICE

[75] Inventors: Helmut Kohler, Mönsheim; Norbert Schumacher, Neuhausen, both of Fed. Rep. of Germany

[73] Assignee: International Business Machines Corporation, Armonk, N.Y.

[21] Appl. No.: 758,642

[22] Filed: Sep. 12, 1991

[51] Int. Cl.$^5$ .................... H03K 19/173; H03K 19/08
[52] U.S. Cl. ................................ 307/465; 307/201; 395/24; 395/25
[58] Field of Search .................... 307/201, 465, 468; 395/24, 25, 27, 20

[56] References Cited

U.S. PATENT DOCUMENTS

| | | | |
|---|---|---|---|
| 4,612,459 | 9/1986 | Pollachek | 307/465 |
| 4,950,917 | 8/1990 | Holler et al. | 307/201 |
| 4,994,982 | 2/1991 | Duranton et al. | 307/201 |
| 4,999,687 | 3/1991 | Luryi et al. | 307/450 |
| 5,019,736 | 5/1991 | Furtek | 307/465 |
| 5,093,900 | 3/1992 | Graf | 395/24 |

FOREIGN PATENT DOCUMENTS 0340890 11/1989 European Pat. Off.
3606406 8/1986 Fed. Rep. of Germany.

OTHER PUBLICATIONS

"Emerging Circuit Technologies, A Reconfigurable CMOS Neural Network", by Graf, IEEE International Solid-State Circuits Conference, Feb. 1990, p. 144.

Primary Examiner—Edward P. Westin
Assistant Examiner—Richard Roseen
Attorney, Agent, or Firm—Douglas W. Cameron

[57] ABSTRACT

A programmable logic cell, compatible with LSSD (Level Sensitive Scan Design) technique, is described whose internal logic function can be initially loaded from an EPROM or external processor. The output or contents of one cell can be connected to another cell to alter the logic operation of the second cell even whilst this second cell is in operation. The cells can be connected together to form a neural network.

12 Claims, 7 Drawing Sheets

FIG. 1
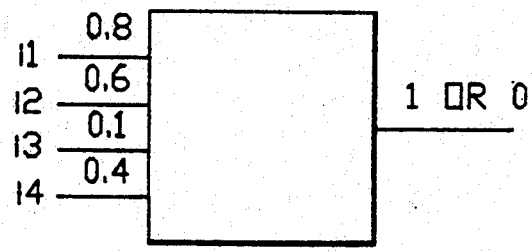
FIG. 2
| I1 | I2 | I3 | I4 | OUTPUT |
|----|----|----|----|--------|
| 0  | 0  | 0  | 0  | 0 |
| 1  | 0  | 0  | 0  | 0 |
| 0  | 1  | 0  | 0  | 0 |
| 1  | 1  | 0  | 0  | 1 |
| 0  | 0  | 1  | 0  | 0 |
| 0  | 1  | 1  | 0  | 0 |
| 1  | 0  | 1  | 0  | 0 |
| 1  | 1  | 1  | 0  | 1 |
| 0  | 0  | 0  | 1  | 0 |
| 0  | 0  | 1  | 1  | 0 |
| 0  | 1  | 0  | 1  | 0 |
| 1  | 0  | 0  | 1  | 1 |
| 0  | 1  | 1  | 1  | 1 |
| 1  | 0  | 1  | 1  | 1 |
| 1  | 1  | 1  | 1  | 1 |
FIG. 4
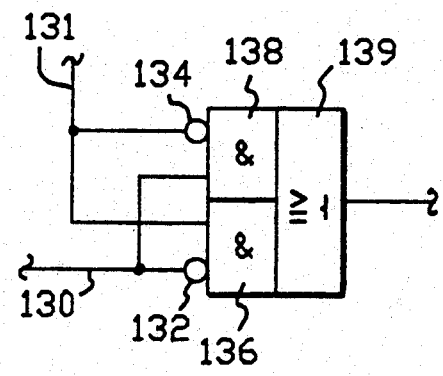

PROGRAMMABLE NEURAL LOGIC DEVICE

FIELD OF THE INVENTION

The invention relates to a programmable logic device whose logic can be set at the beginning of its operation and which can be changed during operation. A number of these devices are connected together such that the output of one device can alter the internal logic function of another.

STATE OF THE ART

Programmable logic or gate arrays have been known for some time. These arrays allow the designer to use a small number of standard components rather than relying on customized designs when designing a logic circuit. Such arrays are produced, for example, by XILINX. In this company's CMOS-based XC3000 Logic Cell (TM) Array Family, the functions of the array are established by a configuration program which is loaded into an internal, distributed array of configuration memory cells. This configuration program is loaded into the array at power-up and may be reloaded on command. The program data resides external to the logic cell in an EEPROM, EPROM or ROM on the application circuit board or on a floppy disc or hard disc. The logic within the cells can be changed whenever required, however, this involves stopping the current operation of the circuit whilst the alterations are carried out.

Attention recently has been focused on neural or neuronal logic devices. These operate by weighting the values of the inputs into the logic device and producing an output which is a function of all the inputs. An example of this is shown by the device in FIG. 1 whose output is either 1 or 0 but whose inputs take various values. For example input 1 (i1) has a weighting value of 0.8, input 2 (i2) of 0.6, input 3 (i3) is 0.1 and input 4 (i4) is 0.4. It might then be decided that if $i1+[i2+i3]+i4>1$ then output=1, otherwise output=

A truth table for this device would have the form shown in FIG. 2. It is possible for the weightings of the individual inputs to be changed using a feedback mechanism; the devices can then undergo a 'learning' process in which the weightings of each input are altered to give the required output in response to a series of inputs. Such a process mimics the learning process of the human brain—hence the name. The action of learning is described in more detail in the German magazine, CHIP, Nr 4, April 1990, pp 11–16, "Auf dem Weg zur Denkmaschine" by THOMAS.

A reconfigurable neural network was presented at the 1990 International Solid State Circuits Conference (see Digest of Technical Papers, 33, pp 144–145, "A reconfigurable CMOS neural network" by GRAF et al). In this device the output currents of the individual 'neurons' are summed on a wire and the result compared with a reference value to give the output. The amount of current from each neuron is altered ('weighted') by programming the width of each FET transistor within the neutron using switches. In this example, the final output of the network could be altered by either varying the reference current value or by changing the amount of current each 'neuron' outputs. The logic of the device is, however, set by the hardwiring within the network.

SUMMARY OF THE INVENTION

The invention described is a novel combination of all of these prior art elements. It consists of a series of logic cells, the internal logic of which can be set to any desired logical value at power up. During operation, the number of inputs to the cell can be altered and its internal logic varied. The commands for changing the cell's function can be either supplied from an off-chip processor or as the result of the logic operation of another cell. The cells are connected together to form a network whose output can be adjusted to take certain values upon the receipt of specified inputs.

BRIEF DESCRIPTION OF THE FIGS.

FIG. 1 shows a neural logic cell with weighted inputs.

FIG. 2 is the truth table for the cell shown in FIG. 1.

FIG. 4 shows the internal structure of the gates to which each input of the logic cell is connected.

DETAILED DESCRIPTION

Figure 3B:
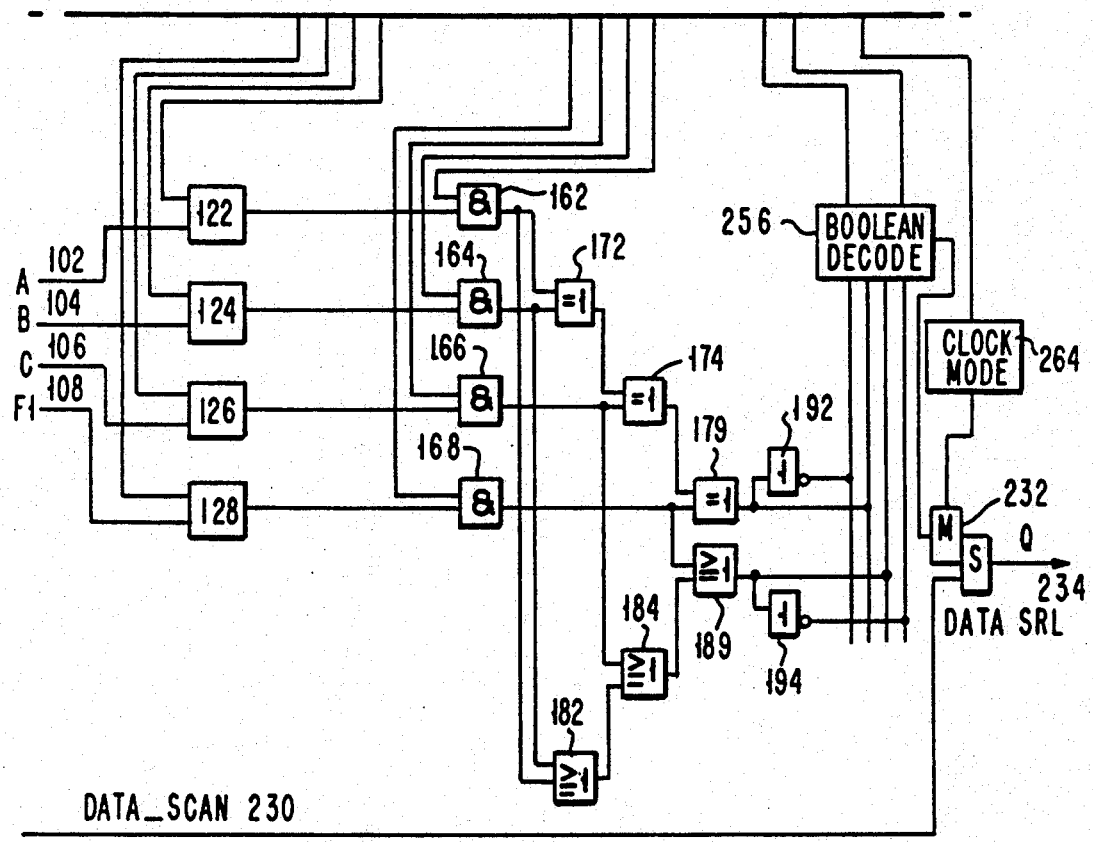
FIG. 3 shows a neural logic cell according to this invention with four inputs.
Figure 3:
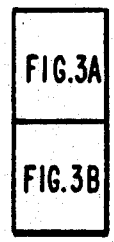
Figure 3A:
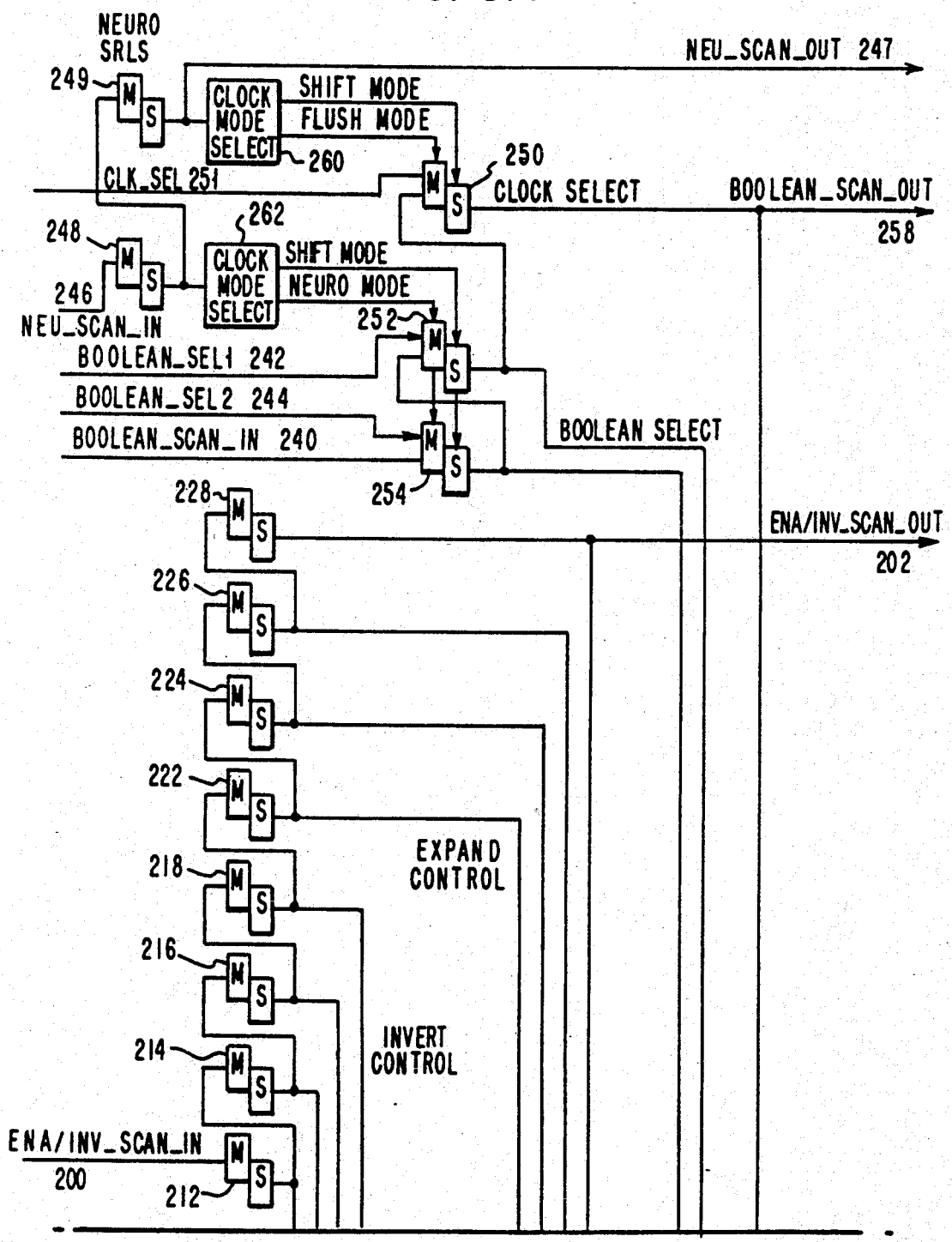

FIG. 3 shows the internal circuit of the programmable neural logic cell of the present invention. It consists of four inputs, (A, B, C and F1) 102, 104, 106 and 108 which are passed to gates 122, 124, 126 and 128 whose other input comes from the master-slave latches 212, 214, 216 and 218. These latches are collectively called the invert control. Depending on the values contained in latches 212, 214, 216 or 218, the outputs of gates 122, 124, 126 or 128 are either the input values A, B, C, F1 or their inverses. The internal structure of gates 122, 124, 126 and 128 is shown in FIG. 4. Each one consists of two inverters 132, 134, two AND gates 136, 138 and an OR gate 139. The input is supplied along line 130 whilst the value held in the master-slave latch 212, 214, 216, 218 is supplied along 131. The output of the gate is produced by OR gate 139. It can be seen, by considering the logic of the circuit, that if the value 0 is supplied from the latch 212, 214, 216 or 218 then the output of the gate will be the same as its input 130. However, if line 131 has value 1 on it, then the output will be the inverse of the input 130.

The output of the gates 122, 124, 126 and 128 is each passed to a separate AND gate 162, 164, 166 or 168 whose other input comes from the 'enable control' formed by master-slave latches 222, 224, 226, 228. These gates select which of the inputs 102, 104, 106, 108 or inverted inputs are to be enabled and hence operated on in the cell. The outputs of these AND gates 162, 164, 166 and 168 are passed to both an XOR gate 172, 174 or 179 and an OR gate 182, 184 or 189. The outputs of the final XOR gate 179 and final OR gate 189 are then connected both directly and thorough inverters 192, 194 to the Boolean decoder 256. Master-slave latches 252 and 254 are connected (via slave output latch) to the Boolean decoder 256. The value of the output latches determines which of the four outputs is passed to the Data Shift Register Latch (SRL) 232 and hence forms the output of the cell Q at 234.

Careful consideration of the circuit will show that it is possible to carry out all possible logic functions for the four inputs. It is clear from the logic of the circuit how XOR or OR combinations of the input can be obtained; the AND function is obtained by using the results of DeMorgan's theorem which states that result, Q, of an AND operation can be expressed in two ways:

Q=A AND B=NOT((NOT A) OR (NOT B))

This result can be generalized for the case of four (or more) inputs. Since the described logic circuit contains inverters for inverting the input (122, 124, 126, 128) and the output (192, 194), it can be seen that the circuit can also perform this function.

Initializing the cell before operation begins involves loading the invert control 212, 214, 216, 218 and enable control 222, 224, 226, 228 latches with values to indicate which inputs are to be enabled and which inverted. Since the latches are connected together as a chain, this is a simple matter of providing the required values at Ena/Inv—Scan—In 200 and clocking them through each latch. To save wiring on the chip, it is possible that the invert and enable control latches of several cells are connected together in a chain (as is shown on FIG. 3) so that the values to be placed in other cells are clocked into one cell using Ena/Inv—Scan—In 200 and out using Ena/Inv—Scan—Out 202. The Boolean select latches 252 and 254 and the clock select SRL 250 are loaded through the Boolean—Scan—In 240, Boolean—Scan—Out 258 and other connected lines in a similar manner.

Figure 7:
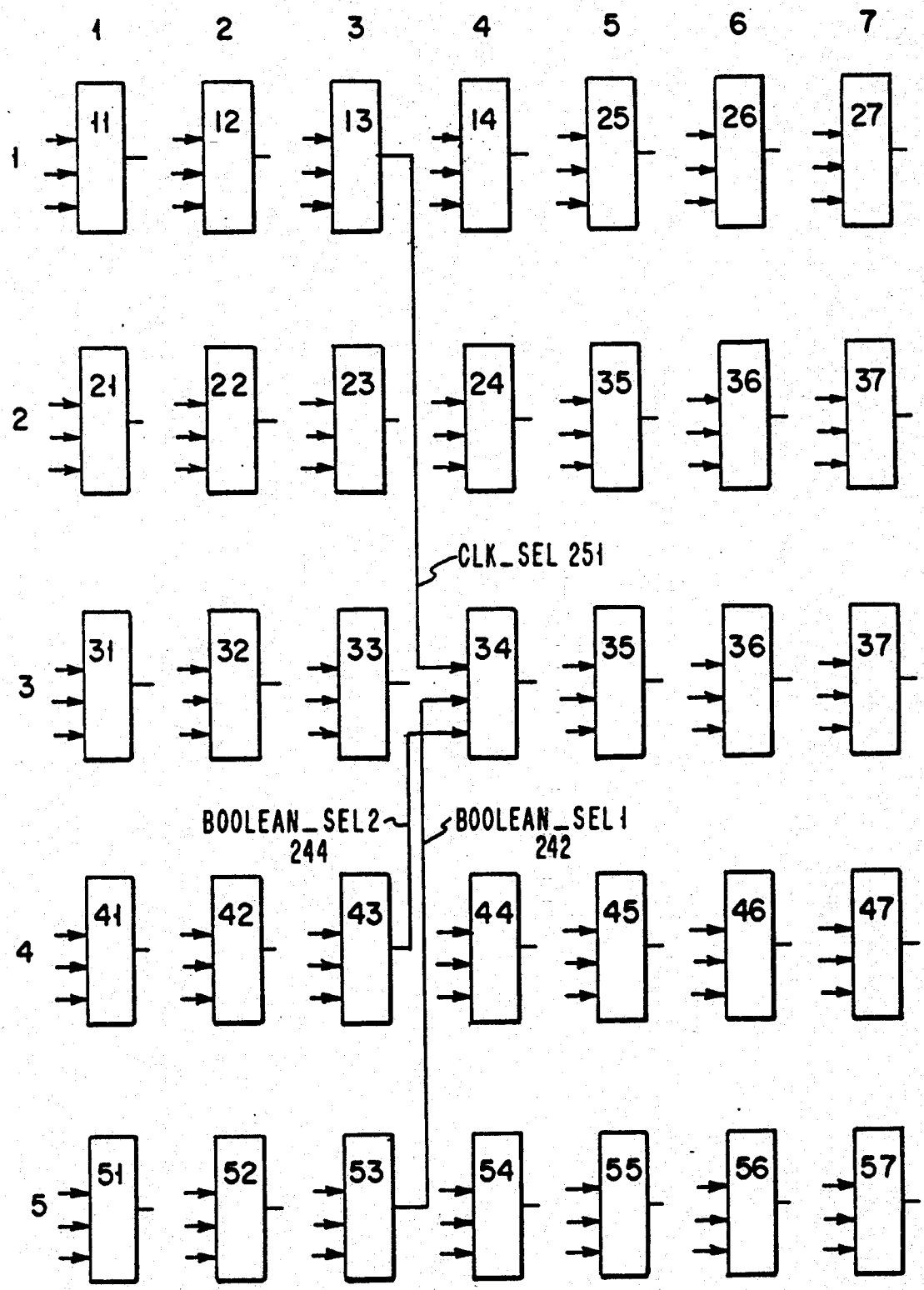
FIG. 7 shows a network of neural logic cells whose outputs are connected to neural inputs.

The signals transferred into the cell on the Neu—Scan—In 246 line are clocked from latch 248 to latch 249 and then out to the next cell on Neu—Scan—Out 247. The latch 248 is connected to Clock mode select 262 which is in turn connected to the Boolean select latches 252 and 254 where its output value determines whether these latches 252, 254 are responsive to the inputs on the Boolean—Sel1 242 and Boolean—Sel2 244 lines. Clock Mode Select 260 is connected to latch 249 and controls the SRL 250. It determines whether the value initially loaded into the SRL 250 is maintained during cell operation (Shift mode) or whether it can be changed during operation by the Clk—Sel input line 251 (Neuro mode). Clk—Sel 251 is connected to the output of a previous cell as is shown on FIG. 7. The output of SRL 250 is connected to clock mode 264 which causes the data SRL 232 to operate in either 'system clock mode' or in 'flush mode'. In the latter mode, both the master and slave latches are continuously active during operation and data is transferred immediately between cells rather than being held in SRL 232 until the next clock cycle. During testing of the circuit, however, the cell will be operated in system clock mode.

The normal (i.e., non-neural) operation of the cell is straightforward. The required logic is loaded from Ena/Inv—Scan—In 200 and the data input at 102, 104, 106 and 108. The result appears at SRL 232 from where it can be transferred out using Data—Scan—In 230. The whole cell can operate in either system clock mode or flush mode depending on clock cycle time requirements.

There are two forms of neural operation. In the first form, the neural mode of the cell is controlled by Clock Mode Select 262. It controls whether the Boolean select latches 252 and 254 operate with the logic mode clocked in through Boolean-—Scan-—In 240 or whether they are responsive to signals on lines Boolean—Sel1 242 and Boolean—Sel2 244. The output of gates 179, 189, 192 or 194 selected by the Boolean decoder 256 will be altered by changes in these signals and hence the cell output, Q, 234 will be changed. It should be noted that the inputs 102, 104, 106 and 108 do not necessarily have to change during this cycle. The values of Clk—Set 251, Boolean—Sel1 242 and Boolean—Sel2 244 may be derived either from inputs generated off the chip or be the results of operations from previous logic cells as shown on FIG. 7.

The second mode of neural operation involves altering the invert control 212, 214, 216 and 218 and expand control 222, 224, 226 and 228 latches. After these have been initially set, their values can be changed during operation by having an extra input to the latch which will determine whether a data input to the cell 102, 104, 106 or 108 should be inverted or ignored during a cycle of operation. These extra latch inputs may either be generated off chip or be themselves the result of a logic operation by another cell as shown on FIG. 6.

Figures 5, 5A, 5B:
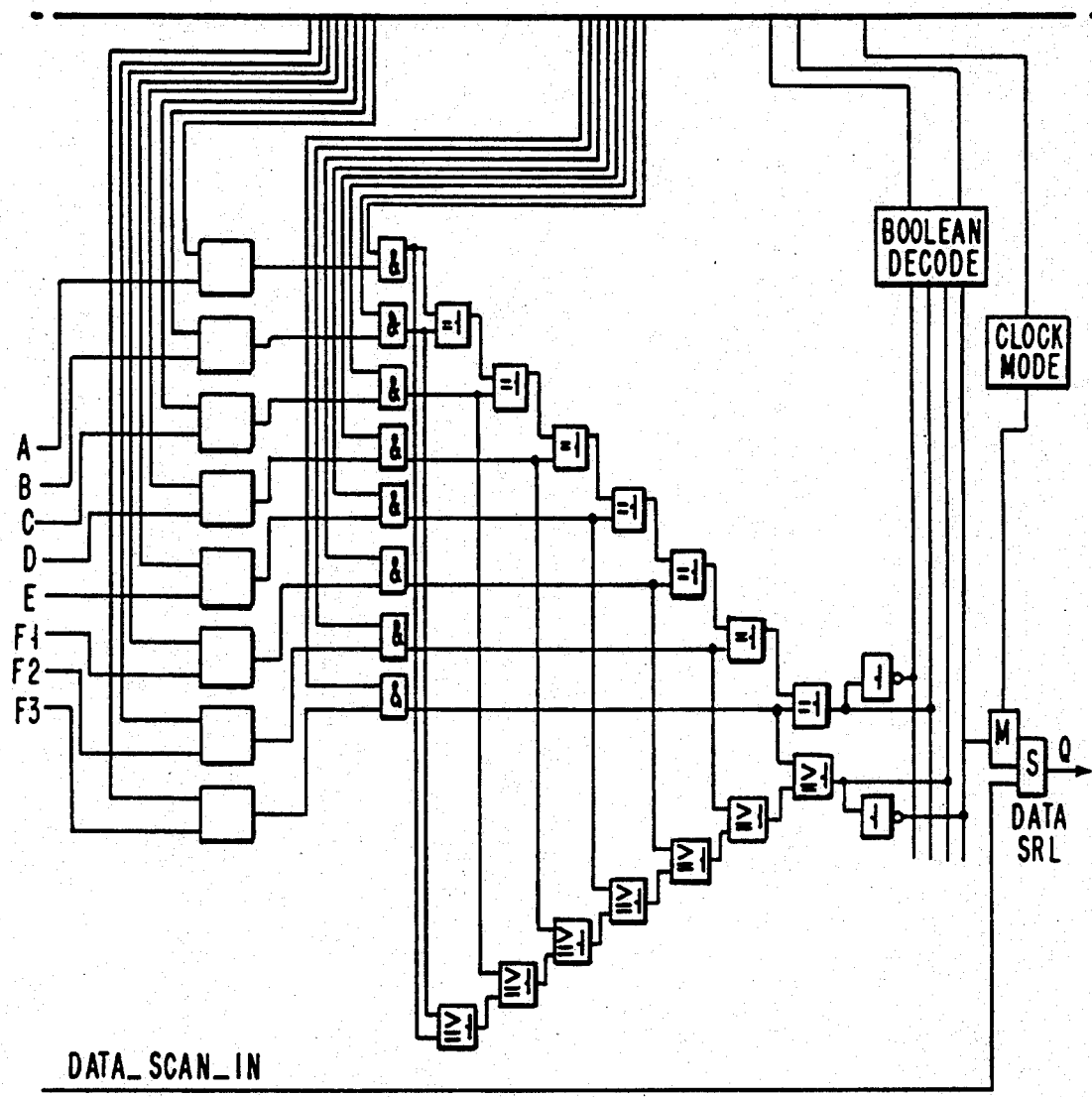
FIG. 5 shows a further embodiment of the neural programmable logic cell with eight inputs.
Figure 5A:
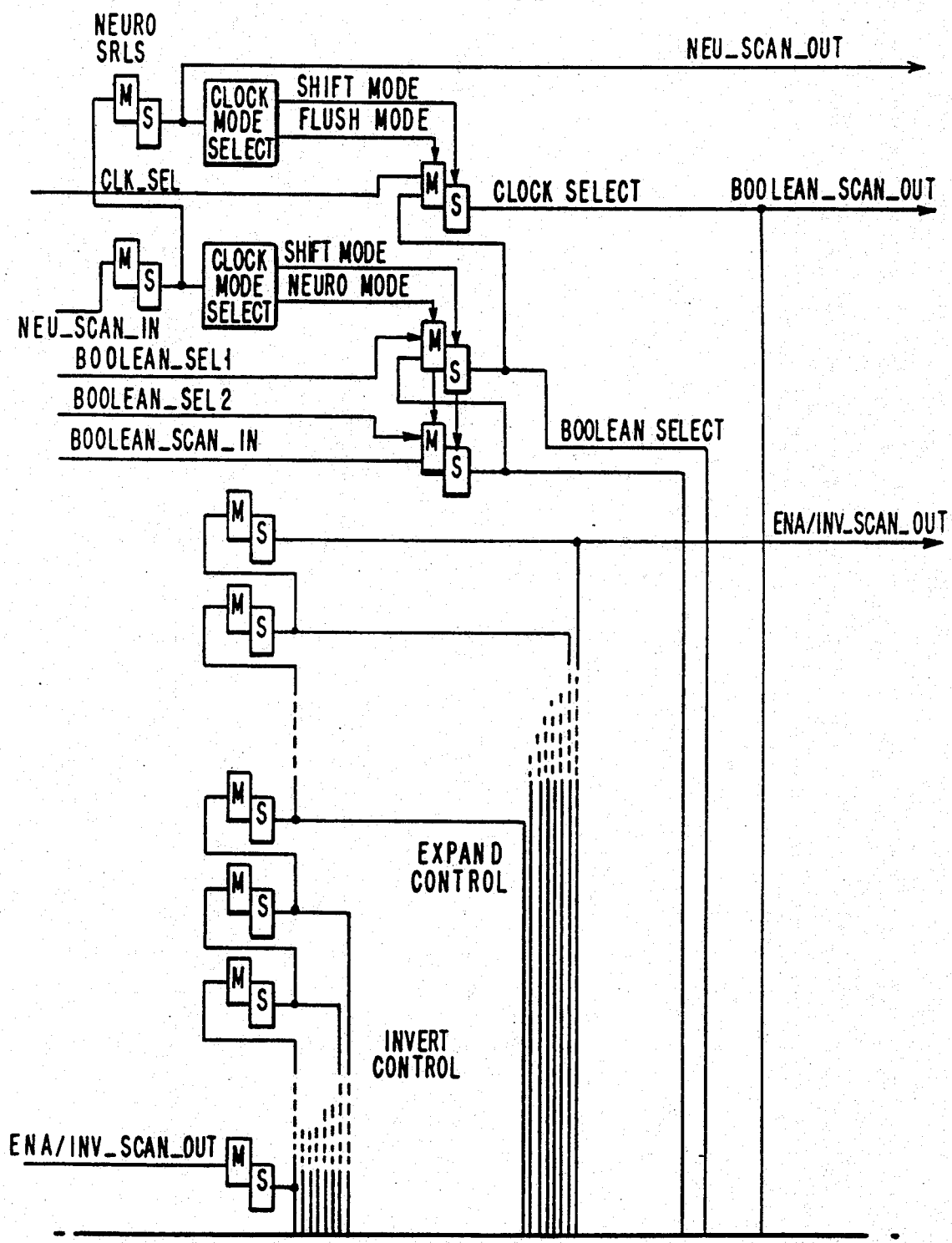

FIG. 5 shows another embodiment of this invention. Instead of having four inputs to each cell, this figure shows eight inputs to the cell and hence each cell has been termed an 'Octopus'. The operation of this cell is exactly the same as that described above except that it is now possible to use up to eight different data inputs which allows a greater variety of applications. In principle, it would be possible to have as many data inputs to one single cell as are required, however, this will lead to complex internal cell configurations which may cause manufacturing problems. If more than eight inputs are required, then it will be better to connect two or more cells together rather than trying to produce one huge cell. A balanced design may consist of a mix of small cells (4 inputs) and large cells (8 inputs).

Figure 6:
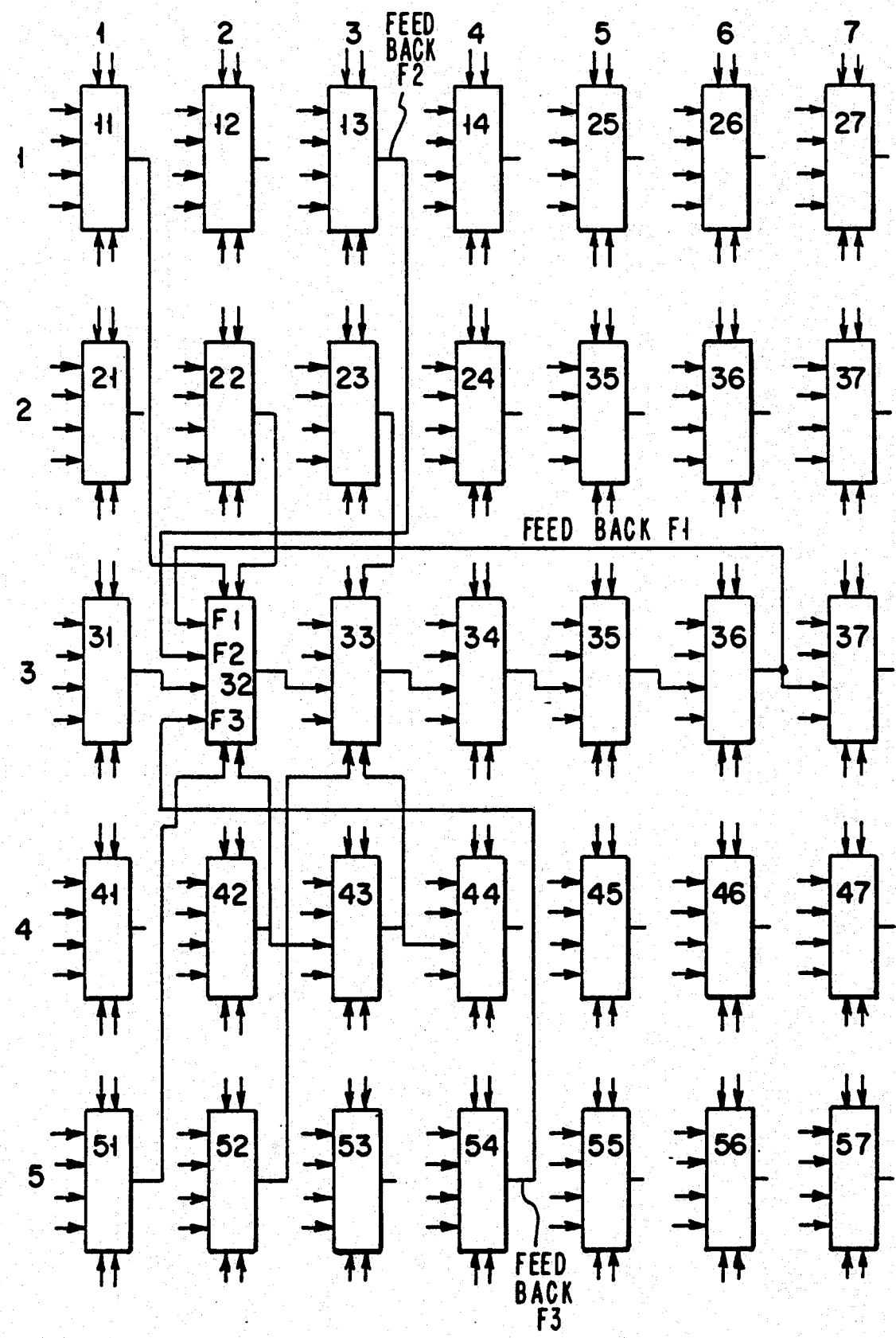
FIG. 6 shows a network of neural logic cells whose outputs are connected to logical inputs.

FIG. 6 shows a typical data net in which octopus cells can be found. It is seen that the outputs of a number of cells are connected to the data inputs of the cells. These connections are formed by hardwiring. Connections between the output of some octopus cells and the Clk—Sel, Boolean—Sel1 and Boolean—Sel2 inputs of FIGS. 3 and 5 (the so-called 'neural connections') are shown on FIG. 7. It should be noted that the wiring is only shown separately on two different figures for simplicity. In practice similar logic cells on the same chip will be connected using the two different but overlapping wiring networks.

We claim:

1. A programmable logic cell comprising:
    data input means having a plurality of data inputs;
    logic means, connected to said data inputs, for performing logical operations on signals on said inputs, said logic means having a plurality of data input enabling means having logic setting signals as input thereto and a plurality of data input inverting means for enabling and inverting said signals on said inputs, respectively, said logic means also having a means for selecting a logic operation from a plurality of operations performed on said signals from said inverting and enabling means;
    setting means for initially setting said logic means, said setting means being connected to said logic means so that said logic setting signals can be used to set a logic operation to be performed by said logic means;
    logic operation changing means connected to said logic means for changing a logic operation to be performed by said logic means during operation of said cell; and data output means connected to said logic means for reading a result of a logic operation of said logic means.

2. A programmable logic cell as recited in claim 1 wherein:
a master-slave latch forming an output (232) of said data output means can be operated in either a system clock mode or a flush mode.

3. A programmable logic cell as recited in claim 1, wherein said logic operation changing means comprises:
an input means (251) to indicate whether the logic operation of the cell is to be changed during operation; and
means (252, 254) responsive to said input means, for operating Boolean decoding means (256) to select which logic operation the cell carries out.

4. A programmable logic cell as recited in claim 3, wherein
signals on inputs (179, 189, 192, 194) to said Boolean decoding means (256) are any logical combination of input data from said data input means (102, 104, 106, 108); and
said Boolean decoding means (256) selects only one of its said inputs (179, 189, 192, 194) to provide a signal for its output (262).

5. A programmable logic cell as recited in claim 3, wherein
said input means (251) of said logic operation changing means and inputs (242, 244) to said means (252, 254) for operating said Boolean decoding means (256) are provided by an output of another programmable logic cell.

6. A programmable logic cell as described in claim 3, wherein
said input means (251) to said logic operation changing means and the inputs (242, 244) to said means (252, 254) for operating said Boolean decoding means (256) are provided by an off-chip controller output.

7. A programmable logic cell as recited in claim 1, wherein said data input inverting means comprises:
a first series of master-slave latches (212, 214, 216, 218) with values of outputs of said latches of said first series determining which of said data inputs of said data input means (102, 104, 106, 107) are to be inverted.

8. A programmable logic cell as described in claim 1, wherein said data input enabling means comprises:
a second series of master-slave latches (222, 224, 226, 228) connected to inputs of AND gates (162, 164, 166, 168), with other inputs of latter said AND gates connected to outputs of said data input inverting means (122, 124, 126, 128).

9. A programmable logic cell as described in claim 1, wherein
a first series of master-slave latches (212, 214, 216, 218) with values of outputs of said latches of said first series determining which of said inputs of said data input means (102, 104, 106, 107) are to be inverted; and
a second series of master-slave latches connected to inputs of AND gates (162, 164, 166, 168), with other inputs of latter said AND gates connected to outputs of said data input inverting means (122, 124, 126, 128), said first series of master-slave latches (212, 214, 216, 218) and said second series of master-slave latches latches (222, 224, 226, 228) being connected so that they can be initially set by clocking through their initial values.

10. A programmable logic cell as described in claim 9, wherein
any or all of the said first (212, 214, 216, 218) and second (222, 224, 226, 228) series of master-slave latches are additionally provided with an additional input which can be used to change their state during operation of the cell.

11. A programmable logic cell as described in claim 10, wherein
said additional input to said first (212, 214, 216, 218) and second (162, 164, 166, 168) master-slave latches is provided by the output of another programmable logic cell.

12. A programmable logic cell as recited in claim 10, wherein
said additional input to said first (212, 214, 216, 218) and second (162, 164, 166, 168) master-slave latches is provided by an output of an off-chip controller.

* * * * *